United States Patent
Fifield et al.

(10) Patent No.: US 6,522,154 B2
(45) Date of Patent: Feb. 18, 2003

(54) OXIDE TRACKING VOLTAGE REFERENCE

(75) Inventors: John Atkinson Fifield, Underhill, VT (US); Mark David Jacunski, Colchester, VT (US); Thomas Martin Maffitt, Burlington, VT (US); Nicholas Van Heel, Eagle, ID (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/811,096

(22) Filed: Mar. 16, 2001

(65) Prior Publication Data
US 2002/0130672 A1 Sep. 19, 2002

(51) Int. Cl.[7] .................................... G01R 27/26
(52) U.S. Cl. ........................ 324/678; 324/522
(58) Field of Search ......................... 324/678, 519–522, 324/229, 249, 452; 361/326, 301, 212; D13/125

(56) References Cited

U.S. PATENT DOCUMENTS

| | | |
|---|---|---|
| 3,801,900 A | 4/1974 | Szasz |
| 5,461,321 A | 10/1995 | Sanders et al. |
| 5,528,153 A | 6/1996 | Taylor et al. |
| 5,804,975 A | 9/1998 | Alers et al. |
| 5,874,734 A | 2/1999 | Elings et al. |
| 6,049,620 A * | 4/2000 | Dickinson et al. .......... 382/108 |

* cited by examiner

*Primary Examiner*—N. Le
*Assistant Examiner*—Amy He
(74) *Attorney, Agent, or Firm*—Scully, Scott, Murphy & Presser; Arthur J. Samodovitz

(57) ABSTRACT

A method of, and a circuit for, measuring a capacitor gate dielectric thickness. The method includes the step of providing a circuit including a gate dielectric capacitor, and charging the circuit with a known current. A voltage output from said circuit is measured, and this voltage is proportional to the gate dielectric capacitor thickness. The present invention may be effectively employed to obtain a number of important advantages. First, because the supply voltage scales with gate dielectric thickness, chip performance is maximized, even when gate oxide runs thick. Furthermore, oxide reliability is not affected because a constant electric field is guaranteed.

14 Claims, 3 Drawing Sheets

OXIDE TRACKING VOLTAGE REFERENCE

BACKGROUND OF THE INVENTION

This invention generally relates to measuring the thicknesses of capacitors formed in integrated circuits such as MOSFETs.

As MOSFETs continue to shrink in size laterally, it is also necessary to scale the gate dielectric thickness. Reliability concerns then limit the maximum voltages which can be placed across these thinner gate dielectrics. For today's 0.15 um technologies and beyond, dielectric reliability often limits the performance which can be achieved by limiting the voltage at which the circuit can operate.

As an example, the maximum voltage which can be reliably placed across a typical gate oxide is calculated by limiting the maximum electric field to −5 MV/cm across the thinnest oxide allowed by the process specification (usually 90% of the nominal oxide thickness). For example, for a 0.15 um DRAM technology, the array FET may have a gate oxide thickness of 5.5±0.5 nm. The maximum permissible word line (gate) voltage is 2.60 V, which ensures that a 5.0 nm thick oxide will meet the reliability criteria. If we could electronically detect that the oxide thickness is 5.5 nm, then we could actually increase the WL voltage by 10% to 2.86 V and still guarantee reliability.

SUMMARY OF THE INVENTION

An object of this invention is to provide a circuit that outputs a voltage that is proportional to a MOS capacitor's gate dielectric thickness.

Another object of the present invention is to provide a circuit that may be used both to output a voltage that is proportional to a MOS capacitor's gate dielectric thickness, and to maintain a minimum electric field for thin gate oxides.

These and other objectives are attained with a method of measuring a capacitor gate dielectric thickness, comprising the steps of providing a circuit including a gate dielectric capacitor, said capacitor having a thickness; charging said circuit with a known current; and measuring a voltage output from said circuit, said voltage being proportional to said gate dielectric capacitor thickness.

The present invention may be effectively employed to obtain a number of important advantages. First, because the supply voltage scales with gate dielectric thickness, chip performance is maximized, even when gate oxide runs thick. Furthermore, oxide reliability is not affected because a constant electric field is guaranteed.

This invention may be employed to obtain performance improvements (i.e., maintaining the maximum reliable electric field for thick gate oxides). However, this circuit can also be used to maintain a minimum electric field for thin gate oxides. For chips which are not limited by performance, maintaining the minimum electric field will improve yield by reducing burn-in fallout and also reduce field failure rates.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

Figure 1:
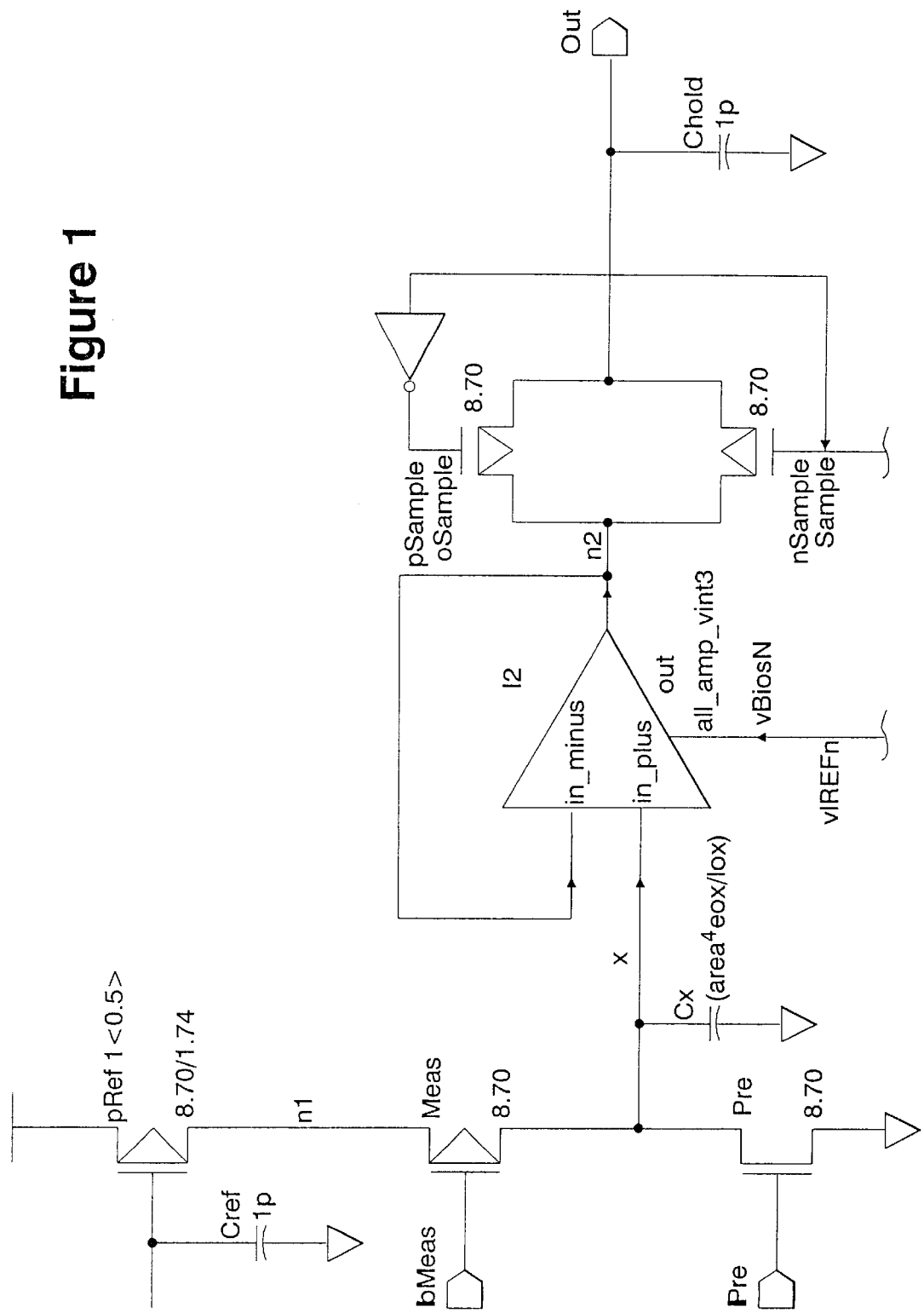
FIG. 1 shows a circuit embodying this invention.

FIG. 1 shows a circuit 10 that outputs a voltage that is proportional to a MOS capacitor's gate dielectric thickness. This information can be used to relax the maximum voltage restrictions imposed by dielectric reliability concerns.

Generally, in operation, circuit 10 is used to charge the MOS capacitor Cx with a known current for a known amount of time so that the resultant voltage at node X is proportional to the dielectric thickness of Cx.

Figure 2:
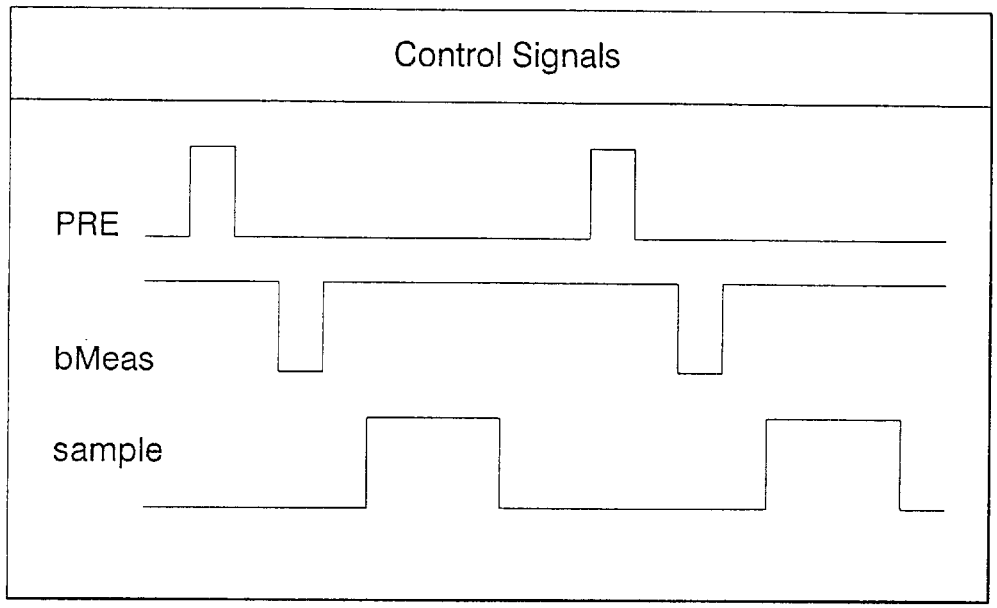
FIG. 2 shows control signals that may be used with the circuit of FIG. 1 to measure a capacitor thickness.

With reference to FIGS. 1 and 2, at the start of the cycle, node X is precharged to ground by cutting off pMEAS and turning on PRE. PRE is then turned off and pMEAS is turned on, allowing a known current to be sourced from pREF1. Node X then charges up linearly for a known time interval. The voltage at node N2 follows that at node X through the unity gain amplifier. Note that the pass gate is open circuited at this point.

PMEAS is then cut off, and the pass gate (nSAMPLE/pSAMPLE) is turned on. The voltage on node N2 is then transferred to capacitor Chold, the pass gate is turned off, and the cycle starts over again.

Figure 3:
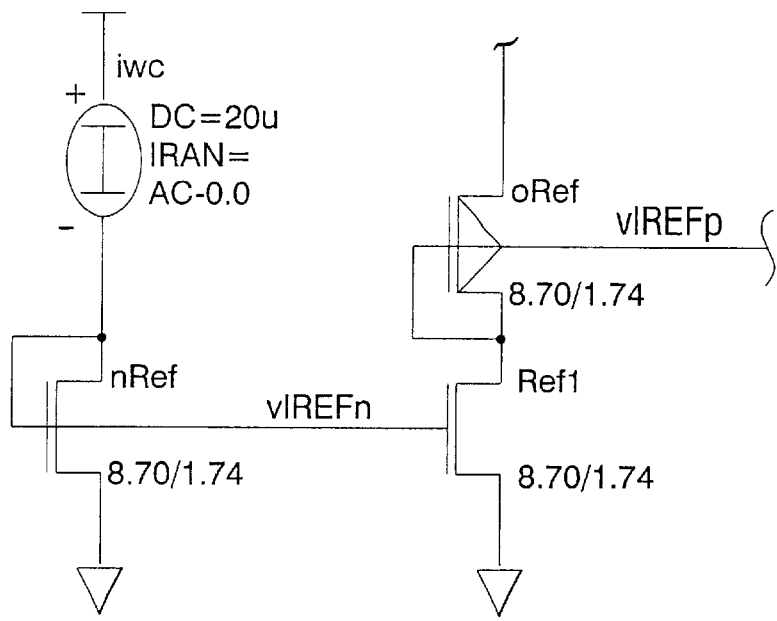
FIG. 3 illustrates details of the circuit of FIG. 1.

As will be understood by those of ordinary skill in the art, any suitable voltage reference source and pass gate may be used in the practice of this invention. As an example, FIG. 3 illustrates a specific reference voltage source that may be employed in circuit 10.

Figure 4:
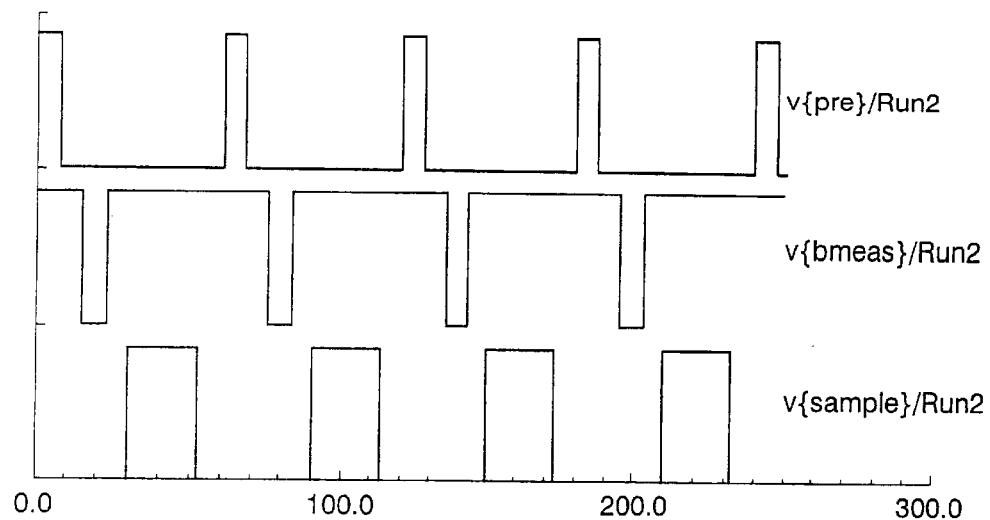
FIG. 4 shows simulation results of the circuit of FIG. 1.
Figure 4:
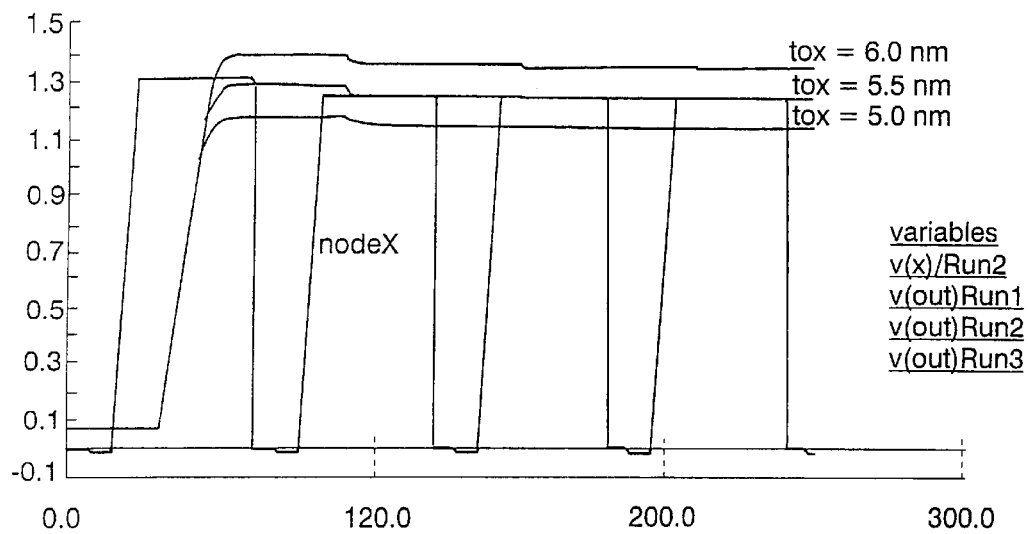

The circuit of this invention has been simulated for a 0.15 um DRAM technology, and the waveforms are shown in FIG. 4, The output voltage is shown for three different oxide thicknesses: 5.5±0.5 nm and is approximately 1.25±0.10 V.

Initially, the output voltage of this circuit may be measured at test, and then fuses blown to adjust the gate voltage appropriately. However, if a controlled time reference is available, then the output voltage could control the gate voltage regulator directly during chip operation.

Several significant advantages may be achieved with the present invention. For example, first, because the supply voltage scales with gate dielectric thickness, chip performance is maximized, even when the gate oxide runs thick. In addition, oxide reliability is not affected because a constant electric field is guaranteed.

This invention has been discussed above in terms of performance improvements (i.e., maintaining the maximum reliable electric filed for thick gate oxides). However, this circuit can also be used to maintain a minimum electric filed for thin gate oxides. For chips which are not limited by performance, maintaining the minimum electric field will improve yield by reducing burn-in fallout and also reduce field failure rates.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method of measuring a capacitor gate dielectric thickness, of an integrated circuit comprising:

providing an integrated circuit including a gate dielectric capacitor, said capacitor having a thickness;

charging said circuit with a known current; and measuring a voltage output form said circuit, said voltage being proportional to said gate dielectric capacitor thickness.

2. A method according to claim 1, wherein the charging step includes the step of charging the circuit with a known current for a known amount of time.

3. A method according to claim 2, wherein the measuring step includes the step of, after the known amount of time, applying the voltage of the circuit to a hold capacitor.

4. A method according to claim 3, wherein:

the providing step includes the step of providing a circuit having a pass gate and a unity gain amplifier between the gate dielectric capacitor and the hold capacitor;

the charging step includes the step of maintaining the pass gate open circuited while charging said circuit; and the measuring step includes the step of activating the pass gate, after the known period of time, to apply the voltage of the circuit to the hold capacitor.

5. A method according to claim 2, wherein:

the providing step includes the step of providing a circuit having a reference current source, a measurement device, and a precharge device; and the charging step includes the step of turning off the precharge device, and turning on the measurement device to apply the reference current to the capacitor.

6. A method according to claim 5, wherein the charging step includes the further step of, after the known period of time, turning off the measurement device to end the application of the reference current to the capacitor.

7. A method according to claim 1, further comprising the step of, prior to the charging step, precharging the circuit to ground by turning on a pre-charge device.

8. A circuit for measuring a capacitor gate dielectric thickness of an integrated circuit comprising:

a capacitor of an integrated circuit having a gate dielectric thickness;

a first circuit portion connected to the capacitor for charging the capacitor with a known current; and a second circuit portion connected to the capacitor for measuring a voltage output form the capacitor, said voltage being proportional to the gate dielectric capacitor thickness.

9. A circuit according to claim 8, wherein the first circuit portion includes means for applying the known current to the capacitor for a known amount of time.

10. A circuit according to claim 9, wherein the second circuit portion includes:

a hold capacitor; and means for applying the voltage of the measurement capacitor to the hold capacitor after the known amount of time.

11. A circuit according to claim 10, wherein the means for applying the voltage of the measurement capacitor to the hold capacitor includes a pass gate and a unity gain amplifier electrically located in series between the capacitor gate and the hold capacitor.

12. A circuit according to claim 9, wherein the means for applying the known current to the capacitor includes:

a reference current source; and a pre-charge device having a first state for connecting the capacitor node to ground, and a second state for applying the reference current to the capacitor.

13. A method for maximizing supply voltage without compromising gate dielectric reliability, comprising:

providing a circuit including a gate dielectric capacitor;

charging said circuit with a known current; and measuring a voltage from said circuit, said voltage being proportional to said capacitor gate dielectric thickness.

14. A method according to claim 13, wherein the measuring step includes the step of, after knew amount of time, applying the voltage of the circuit through a unity-gain amplifier to a hold capacitor, thus maintaining the analog nature of the signal.

* * * * *